(12) United States Patent
Schmidt et al.

(10) Patent No.: US 9,203,208 B2
(45) Date of Patent: Dec. 1, 2015

(54) METHOD AND SYSTEM FOR HIGH POWER PARAMETRIC AMPLIFICATION OF ULTRA-BROADBAND FEW-CYCLE LASER PULSES

(75) Inventors: Bruno E. Schmidt, Montreal (CA); Francois Legare, Saint-Eustache (CA); Heide Ibrahim, Montreal (CA)

(73) Assignee: Institut National de la Recherche Scientifique, Québec (CA)

( * ) Notice: Subject to any disclaimer, the term of this patent is extended or adjusted under 35 U.S.C. 154(b) by 0 days.

(21) Appl. No.: 14/238,792

(22) PCT Filed: Aug. 16, 2012

(86) PCT No.: PCT/CA2012/050557
§ 371 (c)(1),
(2), (4) Date: Feb. 13, 2014

(87) PCT Pub. No.: WO2013/023301
PCT Pub. Date: Feb. 21, 2013

(65) Prior Publication Data
US 2014/0219300 A1  Aug. 7, 2014

Related U.S. Application Data

(60) Provisional application No. 61/524,499, filed on Aug. 17, 2011.

(51) Int. Cl.
*H01S 3/10* (2006.01)
*G02F 1/39* (2006.01)
(Continued)

(52) U.S. Cl.
CPC ............. *H01S 3/10038* (2013.01); *G02F 1/39* (2013.01); *H03F 7/00* (2013.01);
(Continued)

(58) Field of Classification Search
CPC . G02F 2001/392; G02F 1/39; H01S 3/10023; H01S 3/10028; H01S 3/0057
See application file for complete search history.

(56) References Cited

U.S. PATENT DOCUMENTS 5,936,739 A * 8/1999 Cameron et al. .............. 356/441
8,908,262 B2  12/2014 Kermene et al.
2002/0001321 A1 * 1/2002 Perry ............................. 372/22

FOREIGN PATENT DOCUMENTS

JP       5257176         10/1993
WO    2013023301 A1    2/2013

OTHER PUBLICATIONS

Dinev et al. "Dispersion-free amplification of femtosecond dye-laser pulses", Optics Letters, vol. 17, No. 18, pp. 1298-1300 (Sep. 15, 1992).*

(Continued)

*Primary Examiner* — Eric Bolda
(74) *Attorney, Agent, or Firm* — Goudreau Gage Dubuc; Gwendoline Bruneau

(57) ABSTRACT

A system and method for high power parametric amplification based on performing amplification in a frequency domain after time domain pulses are optically Fourier transformed, to overcome bandwidth limitations. In a nutshell, a first optical Fourier transformation of a seed spectrum is performed and parametric amplification is carried out in this spatially dispersed frequency plane. As a consequence, individual parts of the spectrum can be amplified using an optical amplification medium comprising a series of optical amplification units, such as different narrowband crystals, placed one next to each other. Each crystal is tuned independently to optimize its corresponding spectral slice. A second optical Fourier transformation recovers the time domain laser pulses. This method enables scalability of amplified bandwidth and pulse energy at the same time.

15 Claims, 6 Drawing Sheets

(51) Int. Cl.
    *H03F 7/00* (2006.01)
    *H01S 3/23* (2006.01)
    *H01S 3/00* (2006.01)
    *G02F 1/35* (2006.01)

(52) U.S. Cl.
    CPC .. *G02F 2001/3507* (2013.01); *G02F 2001/392* (2013.01); *H01S 3/005* (2013.01); *H01S 3/0057* (2013.01); *H01S 3/2308* (2013.01); *H01S 3/2383* (2013.01)

(56) References Cited

OTHER PUBLICATIONS

Over I. P. Christov "Amplification of femtosecond pulses in a spatially dispersive scheme", Optics Letters, vol. 17, No. 10, pp. 742-744 (May 15, 1992).*
Adachi, et al., "5-fs, multi-mJ, CEP-locked parametric chirped-pulse amplifier pumped by a 450-nm source at 1 kHz", Optics Express (Sep. 15, 2008) vol. 16, No. 19: 14341-14352.
Albert, et al., "5-fs, multi-mJ, CEP-locked parametric chirped-pulse amplifier pumped by a 450-nm source at 1 kHz", Applied Physics B Lasers and Optics (1999), 207-209, Springer-Verlag.
Chichkov, et al., "Spatially dispersive regenerative amplification of ultrashort laser pulses", Optics Express (Dec. 21, 2009) vol. 17, No. 26: 24076-24083.
Faure, et al., "A spatially dispersive regenerative amplifier for ultrabroadband pulses", Optics Communications (1999), 159: 68-73.
Harris, et al., "Oservation of Tunable Optical Parametric Fluorescence", Physical Review Letters (May 1, 1967), vol. 18, No. 18: 732.
Hauri, et al., "Generation of 14.8-fs pulses in a spatially dispersed amplifier", Optic Letters (Jan. 15, 2004), vol. 29, No. 2: 201-203.
Steinmann, et al., "Generation of few-cycle pulses directly from a MHz-NOPA", Optics Express (Oct. 30, 2006) vol. 14, No. 22: 10627-10630.
Zavelani-Rossi, et al., "Few-optical-cycle laser pulses by OPA: broadband chirped mirror compression and Spider characterization", Applied Physics B Lasers and Optics (Jun. 20, 2002) 74 (Suppl.): S245-S251.
G. Cerullo, S. De Siilvestri, Ultrafast optical parametric amplifiers, Review of Scientific Instruments, Jan. 2003, pp. 1-18, vol. 74, No. 1.
C. Vozzi, F. Calegari, E. Benedetti, S. Gasilov, G. Sansone, G. Cerullo, M. Nisoli, S. De Silvestri, and S. Stagira, Millijoule-level phase-stabilized few-optical-cycle infrared parametric source, Optics Letters, Oct. 15, 2007, pp. 2957-2959, vol. 32, No. 20.
A. M. Weiner, Femtosecond pulse shaping using spatial light modulators, Review of Scientific Instruments, May 2000, pp. 1929-1960, vol. 71, No. 5.
A. M. Weiner, Femtosecond optical pulse shaping and processing, Prog. Quant. Electr., 1995, pp. 161-237, vol. 19.
A. Dubietis, R. Butkus, and A. P. Piskarskas, Trends in Chirped Pulse Optical Parametric Amplification, IEEE Journal of Selected Topics in Quantum Electronics, 2006, pp. 163-172, vol. 12, No. 2.
Xu Gu, Gilad Marcus, Yunpei Deng, Thomas Metzger, Catherine Teisset, Nobuhisa Ishii, Takao Fuji, Andrius Baltuska, Rytis Butkus, Volodymyr Pervak, Hideki Ishizuki, Takunori Taira, Takayoshi Kobayashi, Reinhard Kienberger and Ferenc Krausz, Generation of carrier-envelope-phase-stable 2-cycle 740-µJ pulses at 2.1-µm carrier wavelength, Optics Express, 2009, pp. 62-69, vol. 17, No. 1.
L. Canova, X. Chen, A. Trisorio, A. Jullien, A. Assion, G. Tempea, N. Forget, T. Oksenhendler, and R. Lopez-Martens, Carrier-envelope phase stabilization and control using a transmission grating compressor and an AOPDF, Optics Letters, 2009, pp. 1333-1335, vol. 34, No. 9.
B. E. Schmidt, P. Béjot, M. Giguère, A. D. Shiner, C. Trallero-Herrero, É. Bisson, J. Kasparian, J.-P. Wolf, D. M. Villeneuve, J.-C. Kieffer, P. B. Corkum, and F. Légaré, Compression of 1.8 µm laser pulses to sub two optical cycles with bulk material, Applied Physics Letters, 2010, pp. 1-3, 96, 121109.
G. Krasuss, S. Lohss. T. Hanke, A. Sell, S. Eggert, R. Huber and A. Leitenstorfer, Synthesis of a single cycle of light with compact erbium-doped fibre technology, Nature Photonics, , 2009, pp. 33-36, vol. 4.
O. E. Martinez, 3000 times grating compressor with positive group velocity dispersion: application to fiber compensation in 1.3-1.6 µm region, IEEE Journal of quantum electronics, IEEE Journal of quantum electronics, 1987, pp. 59-64 , vol. QE-23, No. 1.

* cited by examiner

METHOD AND SYSTEM FOR HIGH POWER PARAMETRIC AMPLIFICATION OF ULTRA-BROADBAND FEW-CYCLE LASER PULSES

CROSS REFERENCE TO RELATED APPLICATIONS

This application claims benefit of U.S. provisional application Ser. No. 61/524,499, filed on Aug. 17, 2011. All documents above are incorporated herein in their entirety by reference.

FIELD OF THE INVENTION

The present invention relates to parametric amplification. More specifically, the present invention is concerned with a method and system for high power parametric amplification of ultra-broadband few-cycle laser pulses.

BACKGROUND OF THE INVENTION

Generally speaking, the major issues inherent to current amplification methods and system are the opposing requirements for ultra-broadband versus high power amplification. Parametric amplification is currently realized either in a broadband, low gain arrangement referred to as type I amplification, or in a narrowband, high gain configuration referred to as type II amplification [Cerullo03]. Due to phase matching restrictions, a compromise between high amplification factors and reduced amplified bandwidth has to be accepted.

High power amplification of ultra-broadband laser pulses is currently achieved using Optical Parametric Chirped Pulse Amplification (OPCPA) [Dubietis06] using Type I crystals or periodically poled crystals to meet conditions for quasi phase matching, respectively. On the other hand, Type I amplification in a non-collinear geometry (NOPA) can be achieved over broader bandwidths than type II at the expense of lower pulse energies. In both cases the maximum amplification bandwidth is limited. Although OPCPA is a promising approach, capable to support 2 cycle pulses with 740 µJ, this method requires development of new pump sources and its temporal pulse contrast is impaired by significant superfluorescence back ground [Gu09].

In current parametric amplification methods, amplification is carried out in time domain where all spectral components are present at once or in time sequentially in case of OPCPA.

There is still a need in the art for a method and a system for high power amplification of ultra-broadband few-cycle laser pulses in the framework of parametric amplification.

SUMMARY OF THE INVENTION

More specifically, in accordance with the present invention, there is provide a system for high power parametric amplification, comprising at least a first dispersive-and-collimator set; an optical amplification medium located in the Fourier plane of the first dispersive-and-collimator set; and a second dispersive-and-collimator set symmetric to the first dispersive-and-collimator set on an opposite side of said Fourier plane or a reflector at said Fourier plane; wherein a first optical Fourier transformation of a seed beam from a seed source is achieved at the first dispersive-and-collimator set, parametric amplification by overlap of the seed beam with a pump beam from a pump beam source in a spatially dispersed frequency plane using the optical amplification medium occurs in the Fourier plane; and a second optical Fourier transformation is achieved at the second dispersive-and-collimator set, or at the first dispersive-and-collimator set after back refection at the reflector.

There is further provided a method for high power parametric amplification, comprising a first optical Fourier transformation of a seed spectrum and a parametric amplification by overlap of the seed beam with a pump beam in a spatially dispersed frequency plane using an optical amplification medium in the Fourier plane.

Other objects, advantages and features of the present invention will become more apparent upon reading of the following non-restrictive description of specific embodiments thereof, given by way of example only with reference to the accompanying drawings.

DESCRIPTION OF EMBODIMENTS OF THE INVENTION

Figure 1:
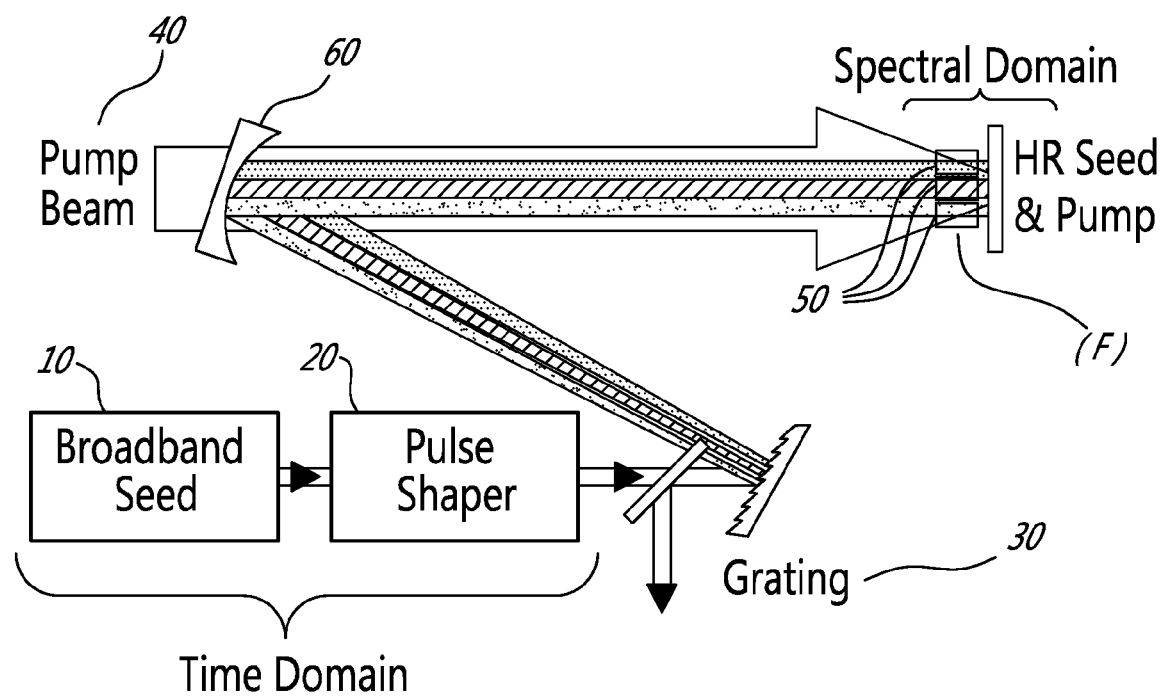
FIG. 1 shows a schematical view of a system according to an embodiment of an aspect of the present invention.

FIG. 1 illustrates a system according to an embodiment of an aspect of the present invention.

A seed beam spectrum, such as ultra-broadband, carrier envelope phase (CEP) stable seed pulses 10 available in different ways as described below, is passed through a dispersive-and-collimator set, comprising for example a first grating 30 and a first cylindrical mirror 60 as a collimator, for a first Fourier transform into the spectral domain, and overlapped together with a pump beam 40 in the Fourier plane (F), where an optical amplification medium, comprising for example several parametric crystals 50 placed side by side, is provided. In the case of crystals as amplification units of the amplification array, each crystal can be tuned individually for optimum phase matching of its corresponding portion of the broadband input seed bandwidth.

The spectrum is then returned, by a reflector (HR seed and Pump) for example in the case of a folded system, to the first dispersive-and-collimator set, i.e. the grating 30 and mirror 60, for a second Fourier transform back to the time domain back.

In the case of an unfolded system in absence of a reflector, the spectrum is returned, after amplification in the Fourier plane (F), to a secondfirct dispersive-and-collimator set (not shown) symmetric to the first dispersive-and-collimator set (30, 60) on the opposite side of the Fourier plane (F).

In FIG. 1, the seed beam spectrum is first sent to a pulse shaper 20, such as a Dazzler, prior to the dispersive-and-collimator set, for fine tuning of spectral phase and amplitude to optimize pulse duration and shape after amplification. Furthermore, the pulse shaper 20 has recently been demonstrated to enable CEP controls of titanium doped sapphire amplifier [Canova09].

Collimation of colors can be alternatively achieved by replacing the cylindrical mirror 60 by a second grating with same groove density than the first grating 30 to provide parallel travel of colors on the amplification plane. The spread of colors could be achieved with transmission gratings or prisms as well.

The dispersive element 30 can be a reflection grating, a transmission grating, a prism or a grism.

It has been found that separate nonlinear crystals 50 in the Fourier plane (F) can be optimized to maximize amplification for their corresponding wavelength regime. For instance, several efficient narrowband type II BBO (Beta-Barium Borate) crystals 50 can be utilized to amplify an entire octave of frequencies.

A spatially matching pump beam 40 can be applied in a noncollinear way to allow straight forward beam separation or by use of dichroic optics to combine the beams collinearly. The pump beam may also be provided collinearly using dichroic cylindrical mirrors 60.

Figure 2B:
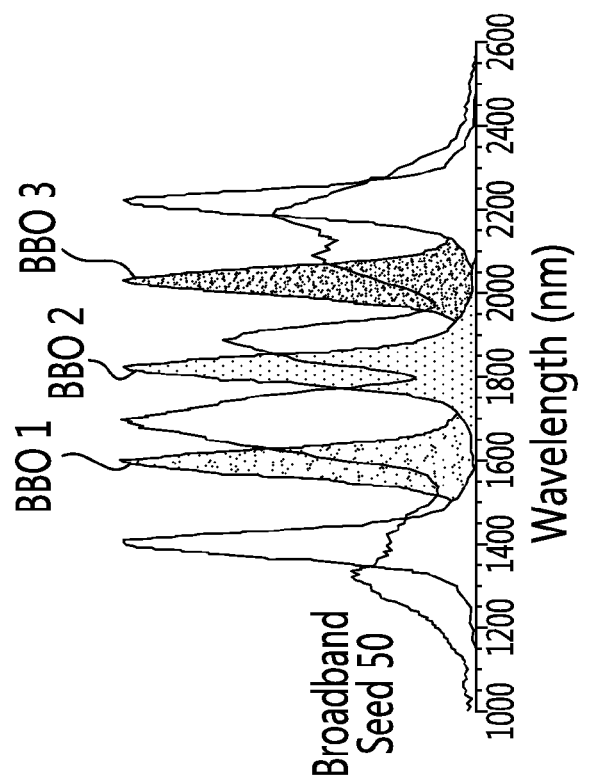
FIG. 2b shows experimental spectra for ultra-broadband seed and type II amplification.
Figure 2A:
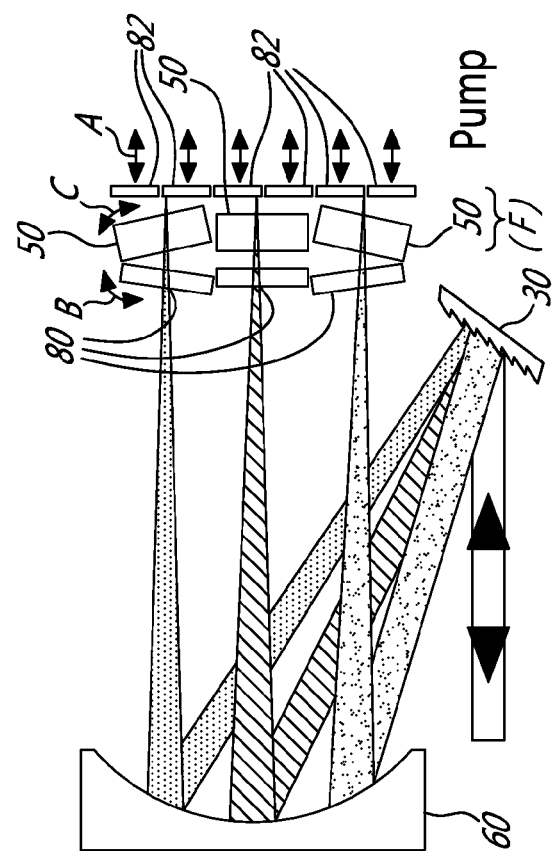
FIG. 2a shows a schematical top view of the system of FIG. 1.

A detail of a Fourier plane configuration is given in FIG. 2a, in the case of a folded system. Optical imaging by the cylindrical mirror 60 takes place only parallel to the dispersion plane, which is perpendicular to the grooves of grating 30. By this, each color is focused to a line focus whose height is equal the crystal height (perpendicular to the drawing in FIG. 2a) and is defined by the input beam diameter.

For low energy seed pulses, ranging between about 1 nJ and 100 µJ, the cylindrical mirror 60 can be replaced by a spherical mirror which focuses each color into a point focus to achieve higher intensity.

As shown in FIG. 2a, the spectral components of the collimated seed beam are horizontally dispersed at the grating 30 and travel parallel after the cylindrical mirror 60. Each component is focused to a line in the Fourier-plane (F) and returned to the grating 30 and mirror 60 by the reflector (HR seed and Pump).

The reflector for back reflection of the seed and pump can be a one piece reflector, as shown for example in FIG. 1. Alternatively, the reflector can be made of a plurality of separate reflectors, such as individual mirrors 82 as shown in FIG. 2a.

Thus, in the Fourier-plane (F), several narrowband nonlinear crystals 50 can be used to amplify corresponding spectral slices. Spectral phase shaping can be carried out by such mirrors 82, which can be translatable (see arrows (A) in FIG. 2a). In case the reflector is a one piece reflector and thus not allowing spectral phase shaping as individual reflectors 82 would do, adjustable compensation plates 80 may be used to ensure temporal and spatial overlap of all components. The compensation glass plates 80 can be tilted (see arrow (B) in FIG. 2a) to correct for the different thicknesses of the crystals 50 and thereby adjusting the phase delay between the different colors. The compensation glass plates 80 also allow spectral phase shaping of the output pulse. Note that in FIG. 2a both mirrors 82 and compensation glass plates 80 are shown, but that compensation glass plates 80 are not necessary in cases when the reflector (HR seed and Pump) is made of individual mirrors 82. Note that a reflector made of a deformable mirror, instead of several mirrors 82, may be used to optimize different phase delays in different regions of the spread spectrum in the Fourier plane.

In any case, by tuning each amplification units 50, such as crystals, phase matching angle by tilting the crystal 50 (see arrow (C) in FIG. 2a), not only amplification gain but also amplitude shaping can be realized.

To increase amplification, both pump 40 and seed beam 10 may be made to interact a second time in the optical amplification medium 50, by being back reflected (see high reflector HR Seed and Pump in FIGS. 1 and 2a in case of a one-piece reflector; see mirrors 82 in FIG. 2a in case of a multi-pieces reflector), to achieve two-stage amplification without additional components.

The present system can also be operated in a single pass configuration without back reflection in the Fourier plane. In this case, a second dispersive-and-collimator set (not shown) is placed symmetric to the first dispersive-and-collimator set (30, 60) as shown on the left hand side of the Fourier plane in FIG. 2a to the right hand side of the Fourier plane to perform the second optical Fourier transformation.

Experimental spectra for ultra-broadband seed and type II amplification via the phase matching angle of crystals are shown in FIG. 2b to illustrate octave spanning type II amplification with five crystals.

Alternatively to type II crystals, type I phase matching crystals can be utilized as well as periodically poled ones in the Fourier plane to enhance the spectral width per millimeter.

Instead of different crystals in the Fourier plane (F), the optical amplification medium array may comprise one crystal with spatially varying phase matching properties, like for instance a spatially varying periodicity in case of periodically poled crystals.

Instead of parametric crystals, real level pumped laser materials, such as real level pumped laser crystals, such as for instance titanium doped sapphire ($Ti:Al_2O_3$) or neodymium-doped yttrium aluminum garnet ($Nd:Y_3Al_5O_{12}$), can be used in the same manner.

Alternatively. to solid state amplification media, liquid or gaseous amplification media could be utilized as well The optical amplification medium may also comprise fiber lasers.

Figure 5:
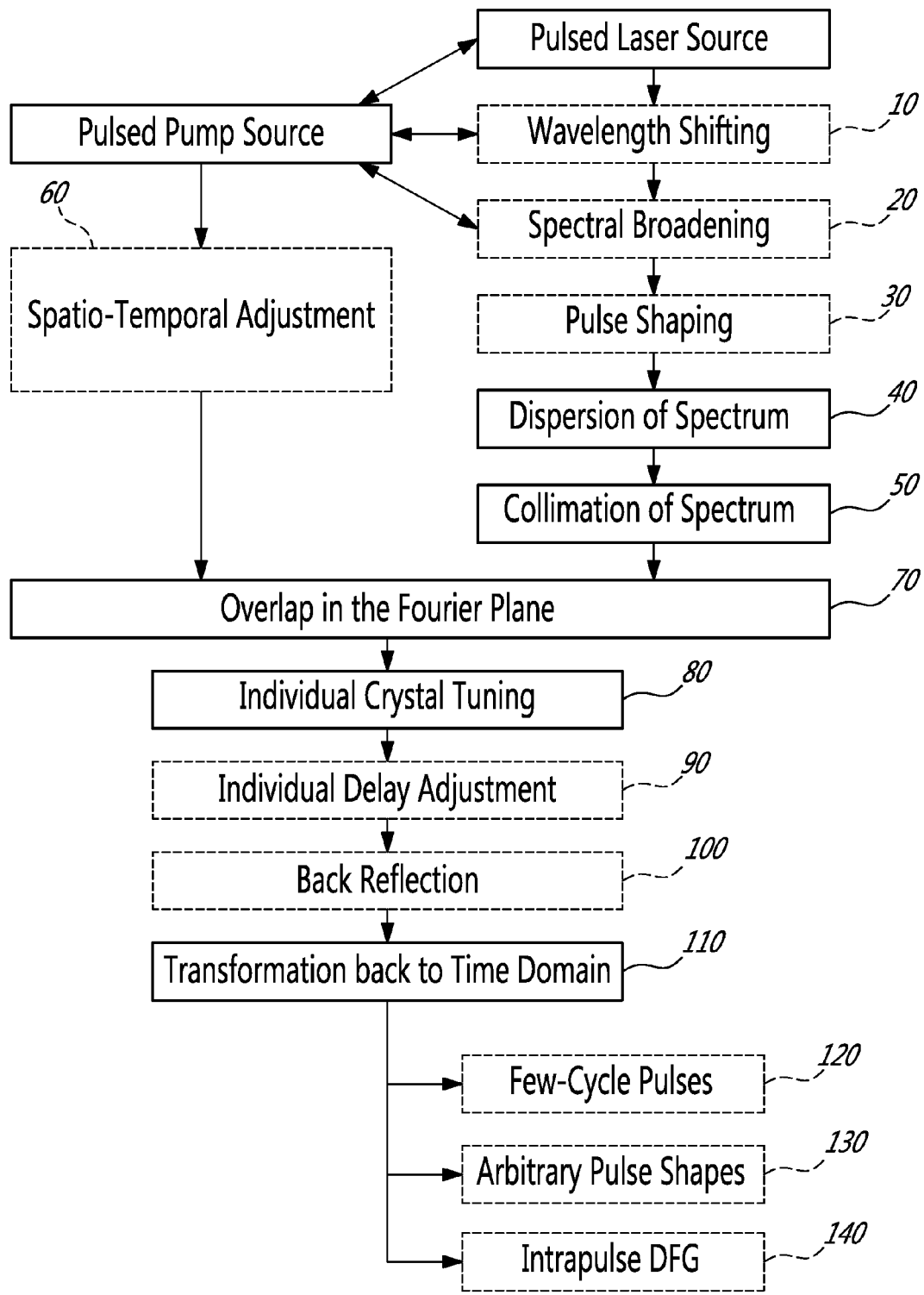
FIG. 5 is a flowchart of a method according to an embodiment of an aspect of the present invention.

In general, spatial dimensioning of the pump beam can be achieved with an anamorphotic telescope to attain spatial overlap with the spread spectrum in the Fourier plane (see step 60 FIG. 5). Maximal temporal overlap is achieved by setting the pump beam duration equal to the one of the seed pulse which is expected to lie in the picosecond regime for the dispersed beam (see step 60 FIG. 5). Its duration is given by the vertical focal width in the Fourier plane which depends on focal length of the cylindrical mirror 60 as well as the groove density of the grating.

To combine pump and seed beam, the cylindrical mirror 60 in FIG. 2a could be a dichroic mirror which transmits pump and reflects seed beam or an additional beam splitter could be inserted after the cylindrical mirror 60 for combination (step 70 FIG. 5).

Figure 3:
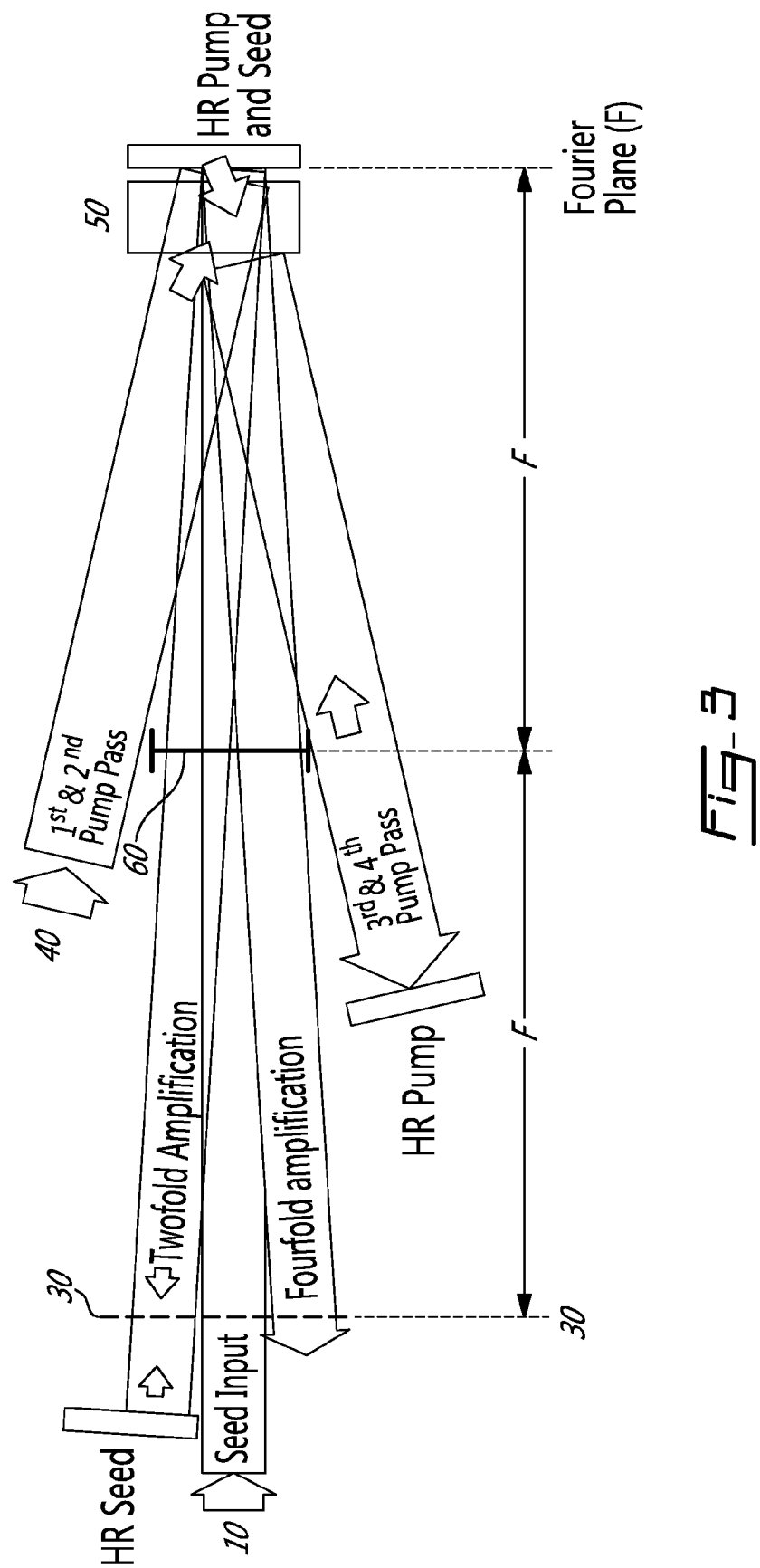
FIG. 3 shows a side view of a four-pass system according to an embodiment of an aspect of the present invention.

Alternatively, the pump beam can be supplied under a small angle with respect to the seed as shown in more detail in FIG. 3.

The beam path in FIG. 2a denotes a double pass through the system, which can be extended to a four pass as shown in FIG. 3.

In FIG. 3, the weak input seed beam 10 enters from the left handside. Reflection grating 30 and cylindrical mirror 60 are shown as transmission optics for clarity. After this dispersive-and-collimator set (30, 60), the seed beam passes the optical amplification medium 50 twice in a first round trip and is back reflected by a first high reflector (see HR pump and seed) towards the grating 30 under a small angle. Those time domain pulses are then send back by a second high reflector (HR seed) into the system.

Correspondingly, the pump beam 40 which passes the cylindrical mirror 60 is back reflected by a third high reflector (see HR pump) to overlay with the twofold amplified beam in time and space. Thus, by adding one reflector for the seed beam (HR seed) and one reflector for the pump beam (HR Pump), four amplification stages can be realized with one set of nonlinear crystals 50.

As mentioned above a symmetric system, i.e. with back reflection at the Fourier plane (F) or with a second collimation and dispersive set on the opposite side of the Fourier plane (F), adds no additional dispersion to the seed beam.

However, the system can also be used as stretcher or compressor, respectively, depending on how the grating separation differs from the focal length [Martinez87]. Thus, large amounts of dispersion that exceed the capability of the pulse shaper 20 (see FIG. 1) can be precompensated, if necessary.

A further point to be addressed is the question how to generate a single-cycle optical pulse. One recently demonstrated option is described in [Krauss09], where single-cycle IR pulses have been generated by synchronizing two different fiber oscillators yielding nJ level pulses. Another promising approach is based on the sub two-cycle pulse compression scheme by nonlinear propagation in a hollow-core fiber (HCF) (see [Schmidt10] for example). The experimental input seed spectrum 10 shown in FIG. 2b supports a single cycle pulse.

The experimental input seed spectrum 10 shown in FIG. 2b supports a single cycle pulse. With the HCF approach, the ability to achieve spectral bandwidths that support single-cycle pulses has been already demonstrated in the laboratory, as shown by the black curve in FIG. 2b. Experimentally achieved bandwidths are presented in FIG. 2b where the black curve corresponds to a broadened supercontinuum in a HCF [Schmidt10] which could serve as seed spectrum. The narrower BBO2, BBO1 and BBO3 amplification spectra correspond to type II amplification (amplification factor=18 for a single pass) with a crystal thickness of 3 mm. This schematic plot illustrates that octave spanning amplification is feasible with only five relatively thick type II BBO's.

Figure 4A:
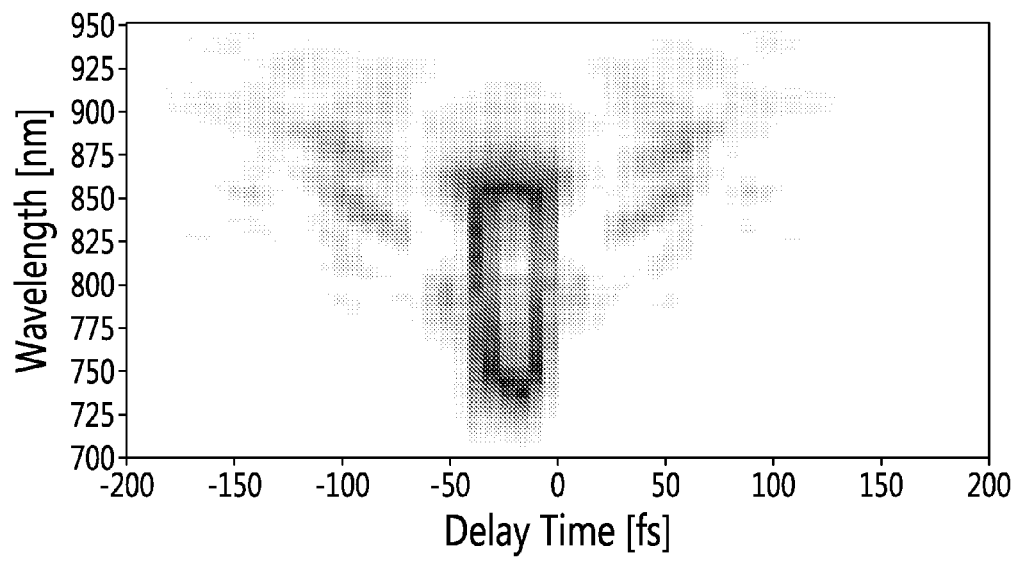
FIG. 4 show a) and b) a temporal characterization of a 2.5 cycle input seed pulse; c) and d) an amplified pulse.
Figure 4B:
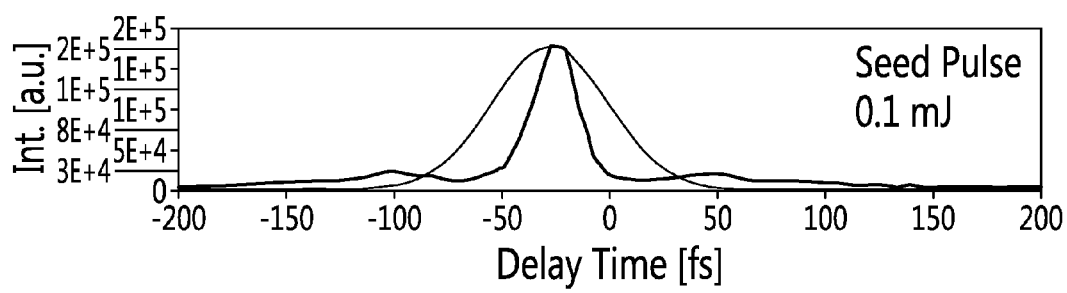

An operational first prototype setup has been built on the 100 Hz laser beam line at the Advanced Laser Light Source (ALLS) of INRS, Varennes, Québec, Canada. The ultra-broadband seed beam centered around 1.8 µm wavelength was provided by spectral broadening of narrowband pulses from a commercial optical parametric amplifier (OPA) in a HCF. After this fiber, 190 µJ pulses were sent to the system which had a total transmission of about 55% yielding 100 µJ at the output without parametric amplification in the Fourier plane. For temporally characterizing the system, a second harmonic generation—frequency resolved optical gating (SHG-FROG) trace was acquired (see FIG. 4a). It showed the possibility to transmit a pulse of 16 femtosecond duration at full width at half maximum (FWHM) denoting 2.6 optical cycles at a central wavelength of 1.8 µm. Pumping was carried out with temporally stretched 800 nm pulses whose spatial beam distribution was adapted to ensure perfect beam overlap of seed and pump beams in the Fourier plane. The pump pulses were stretched to few picosecond duration to achieve optimal temporal overlap and to enable higher pump energy compared to pumping with short, femtosecond pulses.

Figure 4C:
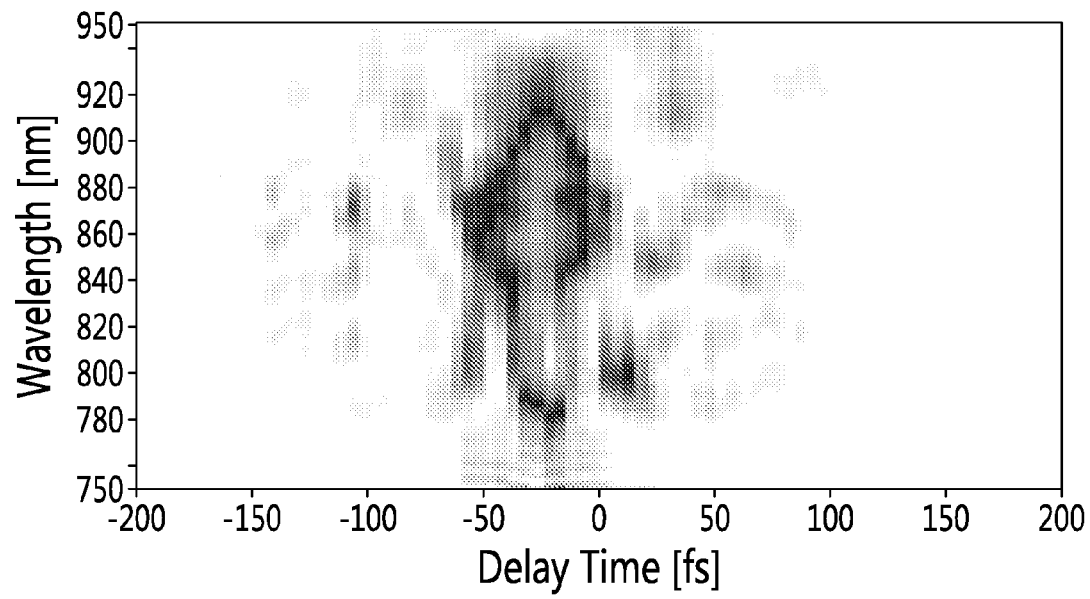
Figure 4D:
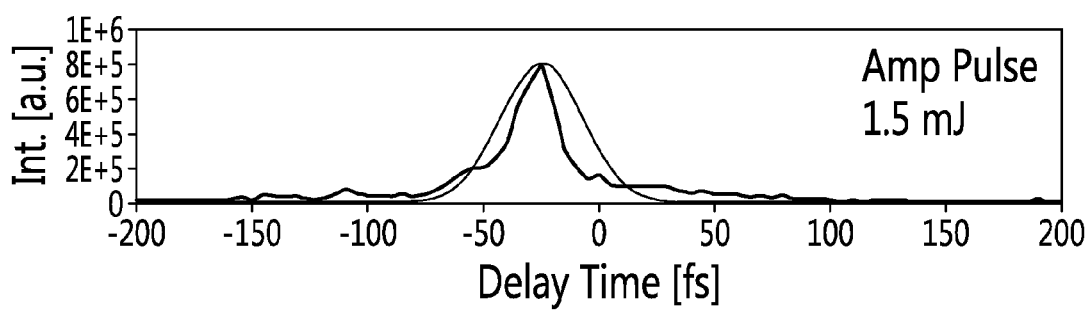

The result of full amplification, i.e. with all crystals tuned for their corresponding wavelength range, yielded 1.5 mJ pulse energy and was characterized temporally and spectrally showing the same bandwidth and duration as the input beam. Remarkably, the FWHM duration did not increase and was measured to be 15 fs, which is equivalent to 2.5 cycles, as shown in FIG. 4c. Carrying energy of 1.5 mJ, this system demonstrated a 15 fold increase of energy. This gain factor denoted an efficiency of 11% for converting pump photons to infrared (IR) photons. These numbers can be compared with other OPCPA in the IR range developed in the recent years at MIT in USA (4.5 optical cycles, 0.8 mJ, conversion efficiency 6.5%) and Max Planck Institute of Quantum Optics in Germany (2.2 cycles, 0.74 mJ).

FIG. 5 is a flowchart of a method according to an aspect of the present invention.

The spectral phases of a seed beam may be optimized, as discussed hereinabove (steps 10-30), before the spectrum is dispersed (step 40) and collimated (step 50). Then it is overlapped with the pump beam in the Fourier plane (step 70), where crystals of an amplification array are tuned individually for optimum phase matching of their corresponding portion of the broadband input seed bandwidth (step 80). The phase delay between the different colors, due to the different thicknesses of the crystals for example, can be compensated for (step 90). To increase amplification, both pump and seed beam may be made to go through the crystal twice (step 100). The beam is then transformed back to the time domain by a second optical Fourier transform (step 110).

Collimation (step 50) may be done using a cylindrical mirror, a second grating with the same groove density than the first grating, a dichroic mirror, transmission gratings, prisms, a cylindrical mirror followed by a beam splitter, or, for low power pulses, a spherical mirror, for example.

In the time domain, different options for nonlinear spectroscopy are possible. Single- and few-cycle pulses may be generated (step 120).

Moreover, additionally to simple pulse shapes, arbitrary pulse shapes may be generated (step 130) and ultimately, applied for pump-probe or coherent control experiments.

Also, instead of utilizing the entire input spectrum, two different parts of the amplified spectrum may be selected and recombined at the output to perform nonlinear wave mixing, such as for instance difference frequency generation (DFG), which offers the possibility of passive CEP stabilization of the DFG pulse (step 140).

As people in the art will now be in a position to appreciate, the present system and method is based on performing amplification in a frequency domain after time domain pulses are optically Fourier transformed, to overcome bandwidth limitations. In a nutshell, a first optical Fourier transformation of a seed spectrum is performed and parametric amplification is carried out in this spatially dispersed frequency plane. As a consequence, individual parts of the spectrum can be amplified using an optical amplification medium comprising a series of optical amplification units, such as different narrowband crystals, placed one next to each other. Each crystal is tuned independently to optimize its corresponding spectral slice. A second optical Fourier transformation recovers the time domain laser pulses. This method enables scalability of amplified bandwidth and pulse energy at the same time.

The present method and system allow single- and few-cycle pulse amplification without superfluorescence background up to the multi mJ level and beyond. The amplification limit is given only by the damage threshold of the gratings since there the beam profile is smallest. Recently, a damage threshold of 1 J/cm$^2$ was reported for 40 fs pulses [ICFO] which implies the scalability up to the Joule level without additional beam expanders prior to the grating.

On the one hand, the present method and system allow increasing the amplification bandwidth compared to type I amplification and, on the other hand, they allow simultaneous up scaling of pulse energy by increasing the number of amplification crystals but still using small and thick, i.e. of large gain per pass, crystals, thus leading to an ultra-broadband, high power amplification.

The present system and methods can be applied not only in the IR spectral range but also in other wavelength ranges, only limited by transparency of nonlinear crystals and availability of pump lasers. Especially, single-cycle pulse amplification in the visible is feasible when pumping with the second harmonic of femtosecond Chirped Pulse Amplification (CPA) lasers at 800 nm wavelength.

Additionally, the present system allows performing difference frequency generation (DFG) at the output by recombining only two sides of the spectrum. By doing so, a CEP unstable input seed pulse can be passively CEP stabilized via intrapulse DFG.

Amplification in the Fourier domain offers several advantages compared to amplification in the time domain as known in the art.

First, as mentioned above, the general problem of gain narrowing is overcome by distributing a large spectral bandwidth over many amplification crystals. Thus, a number of highly efficient narrowband crystals can be used to amplify unprecedented bandwidths.

Second, simultaneous up scaling of bandwidth and energy can be achieved by providing a larger extension of the Fourier plane. For a given spectral bandwidth, and fixed, still small aperture of crystals, i.e. of about 2 mm or less for example, the throughput energy can be increased simply by introducing stronger dispersion of the grating 30 combined with a larger mirror 60. When the Fourier plane (F) extends further, more small crystals are needed. This denotes a huge advantage compared to manufacturing large aperture crystals.

Third, a very good input spatial mode, resulting from propagation in a HCF, is preserved during amplification even with poor pump beam quality. This is because spatial impurities in the frequency plane transfer to homogeneous intensity variations of the spatial mode in the time domain upon optical Fourier transformation. Thus, excellent focusability of the spatial mode is expected without subsequent spatial filtering.

Fourth, the present system intrinsically offers the possibility to perform amplitude and phase shaping throughout the entire bandwidth, i.e. over about one optical octave. Amplitude shaping is achieved by tuning the crystal phase matching angle. Phase shaping in the reflection mode of FIG. 2a for example can be carried out by translating the individual high reflectors 82 (HR) in the Fourier plane (F), or by using a deformable mirror. The resolution depends on the number of mirrors, which can be higher than the number of crystals to increase phase shifting accuracy. In combination to mirrors or in case of a high energy transmission setup, respectively, phase shifting can be achieved by rotation of additional glass plates 80.

Fifth, any superfluorescence generated in the Fourier plane is discriminated from the amplified beam due to its different propagation properties, since superfluorescence co-propagates with the pump beam, and is not recombined with the seed beam by the grating. Thus, this amplification method provides pulses free of superfluorescence background.

Sixth, arbitrary pulse shapes generated by the pulse shaper 20 (FIG. 1) can be amplified without damaging the crystal and without much nonlinear reshaping upon amplification.

The present invention provides a number of advantages, including, for example, scalability of pulse power and spectral width at the same time; utilization of highly efficient narrowband type II nonlinear crystals for amplification; absence of superfluorescence in the output beam; pumped by established CPA techniques; possibility of extracting the conjugated beam given proper design of a second cylindrical mirror and grating; a system inherently enabling additional pulse shaping opportunities.

Although the present invention has been described hereinabove by way of embodiments thereof, it may be modified, without departing from the nature and teachings of the subject invention as recited herein.

REFERENCES

Cerullo03 G. Cerullo and S. De Silvestri, "Ultrafast optical parametric amplifiers," Rev. Sci. Instrum., 74, 1, 2003.
Dubietis06 A. Dubietis, R. Butkus, and A. P. Piskarskas, "Trends in Chirped Pulse Optical Parametric Amplification", IEEE J. Sel. Top. Quantum Electron., 12, 163 (2006).
Weiner95 A. M. Weiner, IEEE Prog. Quantum Electron. 19, 161 (1995).
Vozzi07 C. Vozzi, F. Calegari, E. Benedetti, S. Gasilov, G. Sansone, G. Cerullo, M. Nisoli, S. De Silvestri, and S. Stagira, "Millijoule-level phase-stabilized few-optical-cycle infrared parametric source", Opt. Lett. 32, 2957 (2007).
Gu09 X. Gu, G. Marcus, Y. Deng, T. Metzger, C. Teisset, N. Ishii, T. Fuji, A. Baltuška, R. Butkus, V. Pervak, H. Ishizuki, T. Taira, T. Kobayashi, R. Kienberger, and F. Krausz, "Generation of carrier envelope-phase-stable 2-cycle 740-µJ pulses at 2.1-µm carrier wavelength," Opt. Express 17, 62-69 (2009).
Canova09 L. Canova, X. Chen, A. Trisorio, A. Jullien, A. Assion, G. Tempea, N. Forget, T. Oksenhendler, and R. Lopez-Martens, "Carrier-envelope phase stabilization and control using a transmission grating compressor and an AOPDF," Opt. Lett. 34, 1333, (2009).
Schmidt10 B. E. Schmidt, P. Béjot, M. Giguère, A. D. Shiner, C. Trallero-Herrero, É. Bisson, J. Kasparian, J.-P. Wolf, D. M. Villeneuve, J.-C. Kieffer, P. B. Corkum, and F. Légaré, "Compression of 1.8 µm laser pulses to sub two optical cycles with bulk material", App. Phys. Lett. 96, 121109 (2010).
Krauss09 G. Krauss, S. Lohss, T. Hanke, A. Sell, S. Eggert, R. Huber and A. Leitenstorfer, "Synthesis of a single cycle of light with compact erbium-doped fibre technology" Nature Photonics, 4, 33 (2009).
Martinez87 O. E. Martinez, "3000 times grating compressor with positive group velocity dispersion: application to fiber compensation in 1.3-1.6 µm region", IEEE Journal of quantum electronics, Vol. QE-23, No. 1, 1987.
ICFO http://www.ibsen.dk/highpower/ibsen/attachments/icfo-test-report.pdf/download.

The invention claimed is:

1. A system for high power ultrabroadband parametric amplification, comprising:
  a first dispersive-and-collimator set;
  an optical amplification medium located in the frequency plane of said first dispersive-and-collimator set; and
  one of: i) a second dispersive-and-collimator set symmetric to said first dispersive-and-collimator set on an opposite side of said frequency plane, and ii) a reflector at said frequency plane;
  wherein a first optical Fourier transformation of a time domain seed beam from a seed source into the frequency domain is achieved at said first dispersive-and-collimator set, parametric amplification by overlap of the seed beam with a pump beam from a pump beam source in a frequency plane using said optical amplification medium occurs in the frequency plane; and a second optical Fourier transformation is achieved, from the frequency domain back to the time domain at one of: i) said second dispersive-and-collimator set and ii) said first dispersive-and-collimator set after back refection at said reflector.

2. The system of claim 1, further comprising a seed beam reflector and a pump beam reflector, said seed beam reflector reflecting the seed beam back for a second round trip through said optical amplification medium after a first round trip therethrough, and said pump beam reflector reflecting the pump beam back to overlay with the twofold amplified beam in time and space.

3. The system of claim 1, wherein said seed source is an ultra-broadband, carrier envelope phase (CEP) stable seed source.

4. The system of claim 1, wherein said seed source is a broadened supercontinuum.

5. The system of claim 1, wherein said first dispersive-and-collimator set comprises one of: a reflection grating, a transmission grating, a prism and a grism, and one of: a cylindrical mirror, a dichroic mirror, transmission gratings, prisms, a cylindrical mirror followed by a beam splitter, and a spherical mirror.

6. The system of claim 1, wherein said first dispersive-and-collimator set comprises one of: i) a single dispersive element and ii) a combination of dispersive elements.

7. The system of claim 1, wherein said optical amplification medium comprises at least one optical amplification unit selected in the group consisting of: nonlinear parametric crystals, real level pumped laser materials, fiber lasers and combination thereof.

8. The system of any one of claim 1, wherein said reflector is one of: i) a one-piece reflector, ii) a plurality of mirrors and iii) a deformable mirror, said system further comprising adjustable compensation plates in the frequency plane.

9. The system of claim 1, wherein said optical amplification medium comprises a plurality of optical amplification units, each unit being individually tunable in the frequency plane.

10. A method for high power ultrabroaband parametric amplification, comprising a first optical Fourier transformation into the frequency domain of a time domain seed pulse, and parametric amplification by overlap of the seed pulse with a pump beam in a frequency plane using an optical amplification medium in the frequency plane.

11. The method of claim 10, wherein the optical amplification medium comprises at least one optical amplification unit selected in the group consisting of: nonlinear parametric crystals, real level pumped laser materials, fiber lasers and combination thereof.

12. The method of claim 10, comprising a second optical Fourier transformation from the frequency domain back to the time domain to recover time domain laser pulses.

13. The method of claim 10, further comprising selecting different parts of the amplified spectrum in the frequency domain and recombining them by a second optical Fourier transform to perform nonlinear wave mixing in the time domain.

14. The method of claim 10, comprising pumping the optical amplification medium by a spatially modified pump beam which is modified in at least one of: i) spatial intensity distribution, ii) pump wavelength and iii) intersection angle.

15. The method of claim 10, wherein the optical amplification medium comprises a plurality of individually tunable optical amplification units, the method comprising individually the tuning the optical amplification units for at least one of: i) adjusting the gain, ii) adjusting the spectral shape and iii) adjusting the phase delay.

* * * * *